(12) United States Patent
Minotti

(10) Patent No.: US 12,374,648 B2
(45) Date of Patent: Jul. 29, 2025

(54) CONNECTING STRIP FOR DISCRETE AND POWER ELECTRONIC DEVICES

(71) Applicant: STMICROELECTRONICS S.r.l., Agrate Brianza (IT)

(72) Inventor: Agatino Minotti, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 48 days.

(21) Appl. No.: 17/701,352

(22) Filed: Mar. 22, 2022

(65) Prior Publication Data
US 2022/0320032 A1 Oct. 6, 2022

(30) Foreign Application Priority Data
Mar. 31, 2021 (IT) .......... 102021000008036

(51) Int. Cl.
*H01L 23/00* (2006.01)
*H01L 25/065* (2023.01)

(52) U.S. Cl.
CPC .............. *H01L 24/40* (2013.01); *H01L 24/32* (2013.01); *H01L 24/37* (2013.01); *H01L 24/41* (2013.01); *H01L 24/45* (2013.01); *H01L 24/46* (2013.01); *H01L 24/48* (2013.01); *H01L 24/49* (2013.01); *H01L 24/73* (2013.01); *H01L 24/84* (2013.01); *H01L 25/0655* (2013.01); *H01L 2224/32227* (2013.01); *H01L 2224/32238* (2013.01); *H01L 2224/32245* (2013.01); *H01L 2224/37005* (2013.01); *H01L 2224/37011* (2013.01); *H01L 2224/37013* (2013.01); *H01L 2224/37147* (2013.01); *H01L 2224/37541* (2013.01); *H01L 2224/3756* (2013.01); *H01L 2224/37565* (2013.01); *H01L 2224/37624* (2013.01); *H01L 2224/37639* (2013.01); *H01L 2224/4001* (2013.01); *H01L 2224/4007* (2013.01); *H01L 2224/40095* (2013.01); *H01L 2224/40229* (2013.01); *H01L 2224/40245* (2013.01); *H01L 2224/4103* (2013.01); *H01L 2224/41052* (2013.01); *H01L 2224/41109* (2013.01); *H01L 2224/41174* (2013.01); *H01L 2224/45005* (2013.01); *H01L 2224/45124* (2013.01); *H01L 2224/45147* (2013.01); *H01L 2224/48139* (2013.01); *H01L 2224/48229* (2013.01); *H01L 2224/48245* (2013.01); *H01L 2224/4903* (2013.01); *H01L 2224/49052* (2013.01);

(Continued)

(58) Field of Classification Search
CPC ....................................................... H01L 24/40
USPC ....................................................... 257/775
See application file for complete search history.

(56) References Cited

U.S. PATENT DOCUMENTS

2004/0217488 A1* 11/2004 Luechinger .......... B23K 20/008
257/784
2005/0230820 A1 10/2005 Licht
(Continued)

FOREIGN PATENT DOCUMENTS

EP 2372763 A2 * 10/2011 ........... H01L 23/051

*Primary Examiner* — Ajay Arora
(74) *Attorney, Agent, or Firm* — Seed IP Law Group LLP

(57) ABSTRACT

A connecting strip of conductive elastic material having an arched shape having a concave side and a convex side. The connecting strip is fixed at the ends to a support carrying a die with the convex side facing the support. During bonding, the connecting strip undergoes elastic deformation and presses against the die, thus electrically connecting the at least one die to the support.

20 Claims, 4 Drawing Sheets

(52) U.S. Cl.
CPC ............ *H01L 2224/49175* (2013.01); *H01L 2224/73221* (2013.01); *H01L 2224/73263* (2013.01); *H01L 2224/73265* (2013.01); *H01L 2224/84047* (2013.01); *H01L 2224/84205* (2013.01); *H01L 2224/8484* (2013.01)

(56) References Cited

U.S. PATENT DOCUMENTS

| | | | |
|---|---|---|---|
| 2008/0093729 A1* | 4/2008 | Siepe | H01L 24/05 257/E21.511 |
| 2009/0067131 A1 | 3/2009 | Yasuda et al. | |
| 2010/0207279 A1* | 8/2010 | Law | H01L 24/73 257/E21.511 |
| 2018/0337115 A1* | 11/2018 | Cho | H01L 23/49575 |
| 2019/0333874 A1* | 10/2019 | Bemmerl | H01L 23/49548 |

\* cited by examiner

CONNECTING STRIP FOR DISCRETE AND POWER ELECTRONIC DEVICES

BACKGROUND

Technical Field

The present disclosure relates to a connecting strip for discrete and/or power electronic devices and a discrete and/or power electronic device coupled by the strip.

Description of the Related Art

As is known, dice of semiconductor material integrating electronic devices (whether they are discrete components, more complex circuits or micro-electro-mechanical components) are bonded to a support carrying connection regions and are electrically connected to these connection regions and possibly to other power or discrete devices through connection structures formed by wires or conductive strips (so-called clips).

When the electronic device is a power device, the connection structures are designed to have a current capacity that is adequate with respect to the required current. These connection structures are moreover designed to have an adequate endurance taking into account the application and the specific operating conditions.

BRIEF SUMMARY

One or more embodiments of the present disclosure provide a solution for electrically connecting semiconductor dice and devices, overcoming the drawbacks of the prior art.

According to the present disclosure a connecting strip, an electronic device, and a bonding method are provided.

One example is an electronic device. The electronic device includes a support, at least one die including semiconductor material on the support, and a connecting strip.

The connecting strip has a first side and a second side opposite the first side. The first side is in contact with the at least one die.

The connecting strip includes flat bonding ends bonded to the support and the connecting strip elastically presses against the at least one die.

The connecting strip includes a plurality of die connection projecting areas on the first side between the flat bonding ends. The plurality of die connection projecting areas elastically presses against the at least one die to form an electrical connection.

The connecting strip includes a plurality of recessed areas on the first side between the flat bonding ends. Each of the plurality of recessed areas is between adjacent die connection projecting areas.

The plurality of recessed areas do not contact the at least one die.

In some embodiments, the connecting strip includes a plurality of projecting areas on the second side and a plurality of recessed area on the second side.

Each of the projecting area on the second side is positioned opposite of a corresponding recessed area on the first side. Each of the recessed area on the second side is positioned opposite of a corresponding die connection projecting area on the first side.

In some embodiments, the first side of the connecting strip includes a contact layer and the second side of the connecting strip includes an elastic body. The contact layer is in electrical contact with the at least one die and defines the first side of the connecting strip.

In some embodiments, a thickness of the elastic body is at least three times thicker than a thickness of the contact layer.

BRIEF DESCRIPTION OF THE SEVERAL VIEWS OF THE DRAWINGS

For a better understanding of the present disclosure, an embodiment thereof is now described purely by way of non-limiting example, with reference to the attached drawings, wherein.

DETAILED DESCRIPTION

Figure 1:
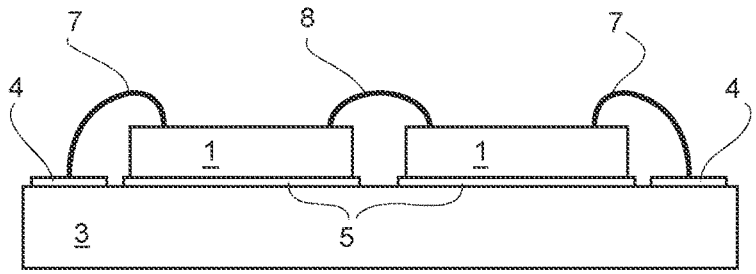
FIG. 1 is a side view of a system formed by two semiconductor dice.

FIG. 1 shows a device comprising two dice 1, of semiconductor material, each integrating an own power component, an integrated circuit, or any other electronic or micro-electro-mechanical element. The dice 1 are bonded to a support 3, for example a printed-circuit board, typically of insulating material, carrying contact regions 4, of conductive material, for example metal, such as copper. The dice 1 are attached to the support 3 by bonding regions 5, for example conductive or non-conductive solder bonding regions.

In FIG. 1, the dice 1 are connected to respective contact regions 4 by first wires 7 (one is represented for each die 1); moreover, the dice 1 are connected together through second wires 8.

Figure 2:
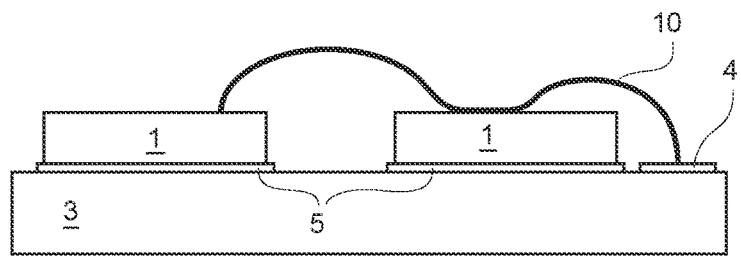
FIG. 2 is a side view of another system formed by two semiconductor dice.

FIG. 2 shows another system where two dice (designated again by 1) are connected together. Wires are generally of aluminum and are bonded by soldering; clips are generally of copper or bronze to be sufficiently stiff in the elastic domain. Bonding may be fusion soldering or powder soldering (sintering).

FIGS. 3-6 show specific embodiments of the connection shown in FIG. 2.

Figure 3:
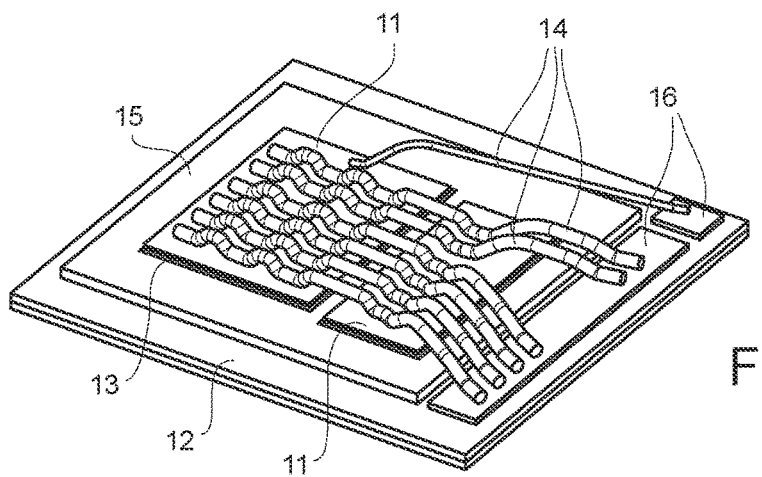
FIG. 3 is a perspective view of an electrical connection solution for the semiconductor dice of FIG. 2.

For instance, in FIG. 3, two dice 11 are attached to a support 12, here a DBC (Direct-Bonded Copper) multilayer, by a bonding layer 13. The top layer of the support 12, appropriately shaped, forms a die contact region 15 and external contact regions 16. Wires 14, of variable thickness, according to the desired current capacity, couple the dice 11 together and to the external contact regions 16.

Figure 4:
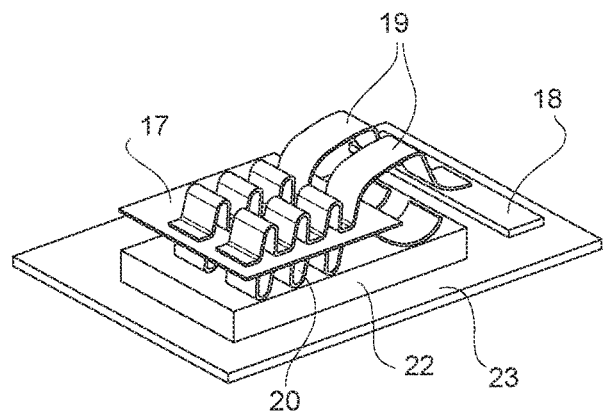
FIG. 4 is a perspective view of another electrical connection solution for the semiconductor dice of FIG. 2.

In FIG. 4, the top surface of a die 17 is connected to external contact regions 18 by top clips 19. A bottom clip 20 couples the bottom surface of the die 17 to a plate 22 bonded to a support 23. The clips 19, 20 are generally pre-folded from a plane strip so as to form a plurality of bends.

Figure 5:
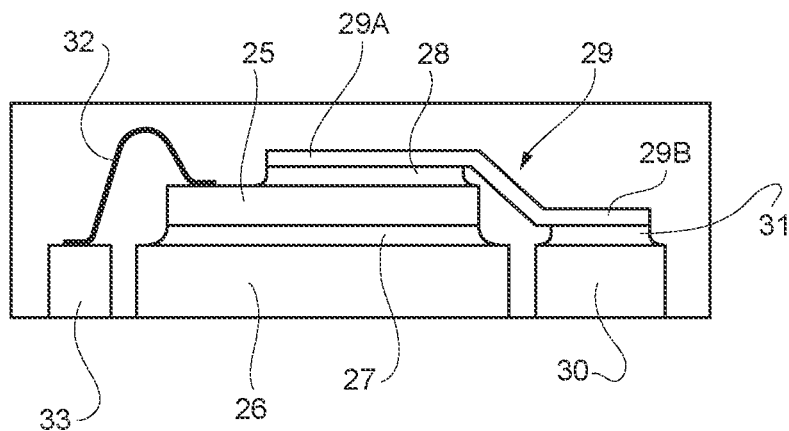
FIG. 5 is a side view showing another possibility for connection a semiconductor die.

FIG. 5 shows a die 25, bonded by a bottom solder layer 27 to a support 26 that is part of a metal leadframe also forming a first and a second external contact region 30, 33. A metal clip 29, typically of copper, electrically connects the power die 25 to the first external contact region 30. The metal clip 29 comprises a first plane portion 29A bonded to the power die 25 by a top solder layer 28, of conductive material, which occupies a fair amount of the area of the die 25, and a second plane portion 29B, bonded to the first contact region 30 by a further solder layer 31, which is also of conductive material. A wire 32, of aluminum, connects a different portion of the surface of the power die 25 to the second external contact region 33 and has a current capacity lower than the metal clip 29.

Figure 6:
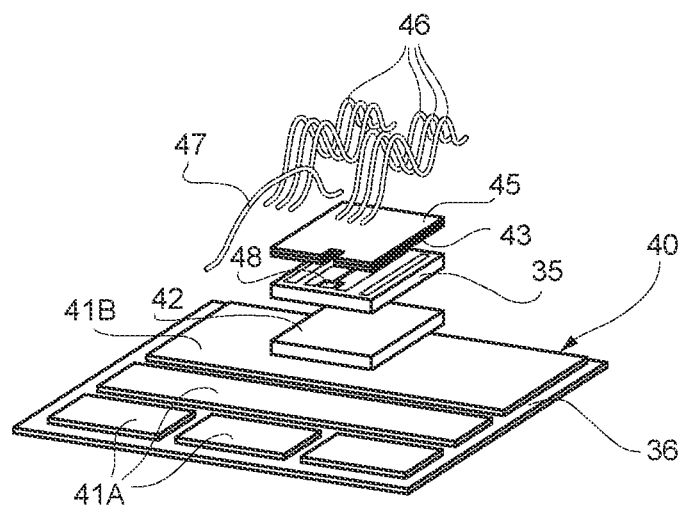
FIG. 6 is a perspective view of a semiconductor die.

FIG. 6 shows fixing of a die 35 to a ceramic support 36 formed as multilayer. Specifically, the support 36 has a top layer 40 that is conductive, for example coated with silver alloy, and shaped to form external contact regions 41A and a die contact region 41B. The die 35 is fixed to the die contact region 41B by a first adhesive region 42 formed by a pre-applied sinter paste. A second adhesive region 43 is applied between the top surface of the die 35 and a copper foil 45 having a plating, for example NiPdAu plating (not represented). Power bonding wires 46, of copper, are soldered to the copper foil 45 and to some of the external contact regions 41B, for electrical connection of the die 35. A further bonding wire 47, of aluminum, connects a contact pad 48 of the die 35 to a respective external contact region 41A.

FIGS. 1-6 illustrate some approaches in the related art. In all the shown electrical connection solutions, the problem of endurance of the soldering exists. In fact, because of the different coefficient of thermal expansion (CTE) between the bonding wires or clips and the silicon die, the soldering may be subject to degradation and the wire or clip may detach (bond off phenomenon), in particular in case of thermal variations and/or mechanical stresses.

Generally, it has been seen that connections obtained by soldering have a greater resilience as compared to connections obtained by sintering, but neither of the two techniques provides sufficient reliability in some applications, for example in the automotive sector.

To improve adhesion and endurance, techniques have been developed based upon wet metal, e.g., the forming a stack of metal layers (typically Ti—Ni—Au or Ag), which enables the top part of the die to be wettable and solderable to a clip. Such a stack of materials may be formed also on the rear side of the die, to be able to bond it to the support 36. These techniques are, however, costly and involve the use of a costly soldering material.

Figure 7:
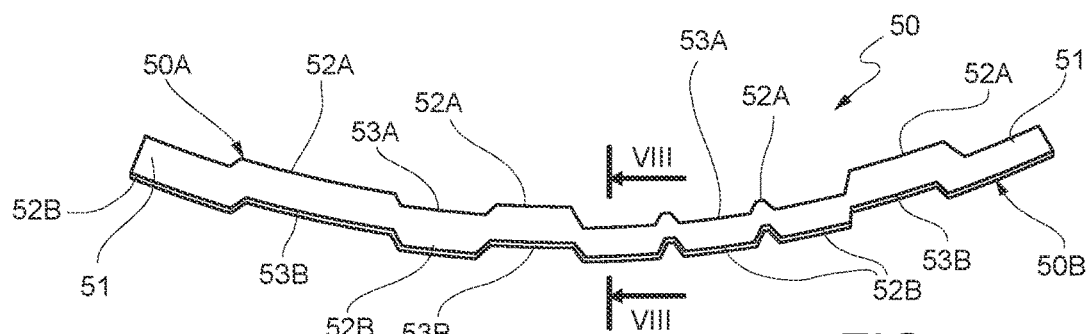
FIG. 7 is a side view of a strip that can be used for electrical connection of an electronic device.
Figure 8:
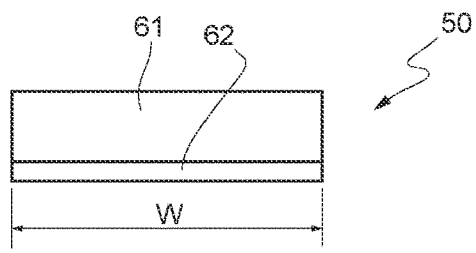
FIG. 8 is a cross-section of the connecting strip of FIG. 7, taken along section line VIII-VIII of FIG. 7.
Figure 9:
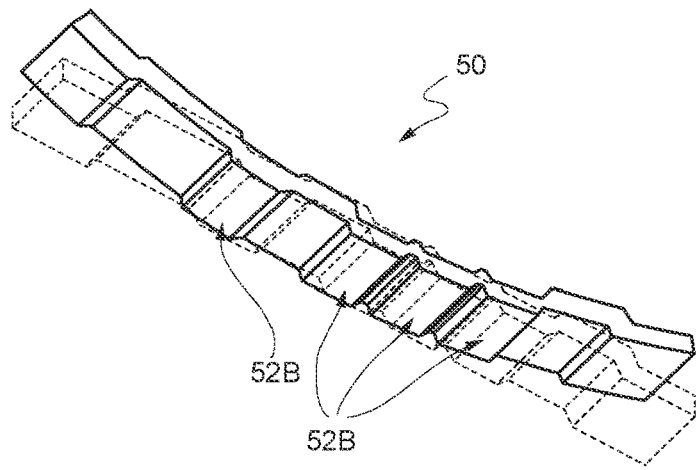
FIG. 9 is a perspective bottom view of the connecting strip of FIG. 7.

FIGS. 7-9 show a connecting strip 50, also called clip, usable for electrical connection of one or more semiconductor dice together and/or to contact regions. The semiconductor die or dice may integrate a discrete electronic component, an electrical circuit or other electronic and/or micro-electro-mechanical component. Typically, at least one of the dice integrates a power component and/or a high-current component. For instance, the die or dice may integrate power devices such as IGBTs, diodes, high-voltage or low-voltage MOS transistors, silicon-based or silicon-carbide-based devices.

In the embodiment shown in FIGS. 7-13, the connecting strip 50 is used to contact two dice (designated by 72, 73 in FIGS. 10-13) together and to a support 70; however, the connecting strip 50 may be used for contacting a single die to one or more contact regions on a support or simply for coupling a number of dice together.

In detail, the connecting strip 50 is of a conductive elastic material, and has an elongated shape, folded so as to define an overall arched or bowed shape.

In the undeformed condition, prior to welding to the support 70, the connecting strip 50 has a concave side 50A and a convex side 50B and is designed to be fixed to the support 70 on its convex side 50B, as discussed in greater detail hereinafter.

The connecting strip 50 has ends 51 and is designed to be fixed to the support 70 at the ends 51 so as to block the dice 72, 73 against the support 70.

In the embodiment shown, the connecting strip 50 is formed by a sequence of flat portions. Also the ends 51 are flat so as to enable welding.

In detail, the connecting strip 50 has, at least on the convex side 50B, projecting areas and recessed areas. In the embodiment shown, both the concave side 50A and the convex side 50B have projecting areas and recessed areas.

In particular, the projecting areas and the recessed areas on the concave side 50A are designated by 52A and by 53A, respectively; the projecting areas and the recessed areas on the convex side 50B are designated by 52B and by 53B, respectively. In addition, each projecting area 52A on the concave side 50A corresponds to a recessed area 53B on the convex side 50B and each recessed area 52A on the concave side 50A corresponds a projecting area 52B on the convex side 50B.

In particular, in FIG. 7, wherein the connecting strip 50 is designed to contact four contact pads, arranged on two different dice (as described hereinafter with reference to FIG. 11), the convex side 50B has four projecting areas 52B, interspersed with three recessed areas 53B; the projecting areas 52B on the convex side 50B correspond to recessed areas 53A on the concave side 50A.

Here, the ends 51 are formed by projecting areas 52B on the convex side 50B.

The projecting areas 52B on the convex side 50B are approximately flat, so that they can be pressed flat down against contact pads (see FIG. 11) on the surface of the dice 72, 73 and on the support 70, as explained hereinafter.

The connecting strip 50 of FIGS. 7 and 8 is formed by an elastic body 61 coated by a contact layer 62.

The elastic body 61 may be copper or a copper alloy, such as bronze, and have a rectangular cross-section (see FIG. 8) with a thickness comprised between 300 µm and 1 mm, in particular between 300 and 800 µm.

The contact layer 62 is of a softer material than the elastic body 61; for example, it may be aluminum and have a thickness smaller than the thickness of the elastic body 61, for example comprised between 50 µm and 100 µm. Alternatively, it could be a silver alloy, with a thickness comprised between 3 and 5 µm.

The connecting strip 50 may have a width W (FIG. 8) comprised between 2 and 5 mm.

The connecting strip 50 may be manufactured by hot laminating an aluminum layer on copper or bronze and cutting it into strips, which are then wound in a coil. The coil is then folded to obtain the projecting areas and the recessed areas 52A, 52B, 53A, 53B and singulated.

Figure 10:
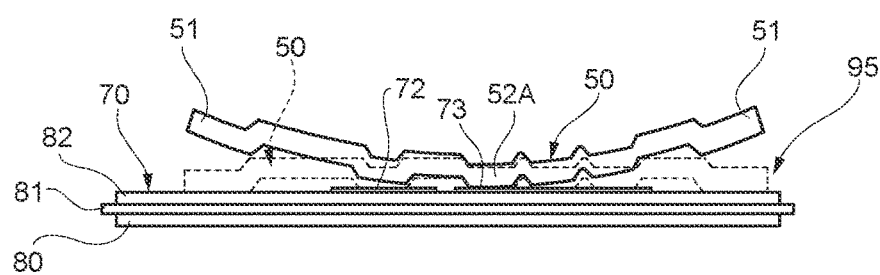
FIG. 10 is a side view of the connecting strip of FIG. 7, in two steps of bonding to a support.
Figure 11:
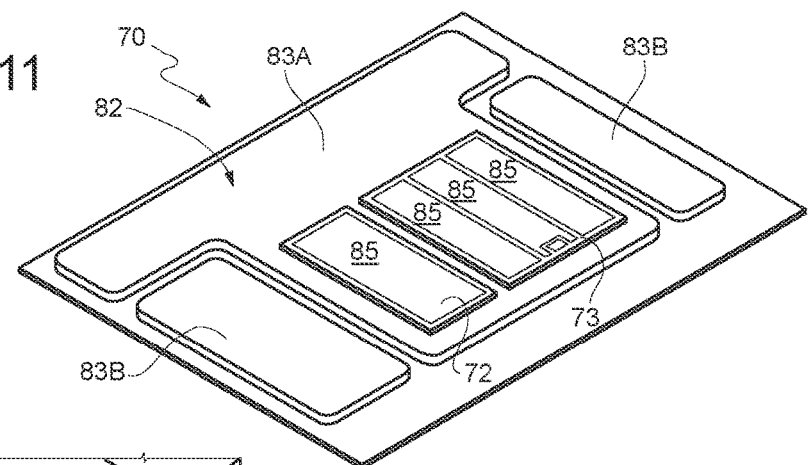
FIG. 11 is a perspective view of a shaped support usable for connection of a power device.

In FIG. 10, the connecting strip 50 is represented with a solid line in the undeformed condition, prior to bonding to the support 70, and with a dashed line in the deformed condition, after bonding to the support 70.

The support 70 is here formed by a multilayer, for example a DBC (Direct-Bonded Copper) multilayer, and the two dice 72, 73 have already been attached thereon.

In the example shown (see also FIG. 11), the substrate 70 comprises a bottom layer 80, of conductive material such as copper; an intermediate layer 81, electrically insulating and typically ceramic material, such as alumina ($Al_2O_3$) or aluminum nitride (AlN); and a top layer 82, of conductive material, such as copper. The top layer 82 is suitably shaped to form contact regions. In the example shown, the top layer 82 forms a die contact region, designated by 83A, and the dice 72, 73 and two connection contact regions, designated by 83B, have been bonded thereon.

The die contact region 83A and the connection contact regions 83B are aligned to each other, so that the connecting strip 50 can be arranged on, and in contact with, both the connection contact regions 83B and the dice 72, 73.

The dice 72, 73 have contact pads 85 (in the example shown, the first die 72 has one contact pad 85 and the second die 73 has three contact pads 85); the contact pads 85 are typically of aluminum, for example with a thickness of 4-9 μm.

As mentioned above and may be seen in FIG. 10, the connecting strip 50 is arranged with the convex side 50B facing the support 70 and the dice 72, 73, and is welded to the support 70.

In particular, the connecting strip 50 is arranged so that the projecting areas 52B on its convex side 50B are positioned at the dice 72 and 73 and, more precisely, at the contact pads 85, and that the ends 51 arrange at the connection contact regions 83B. In order to enable welding, the connecting strip 50 is pressed at the ends 51 and undergoes deformation, flattening out.

After welding, the device formed by the dice 72, 73, by the support 70 and by the connecting strip 50, and designated by 95, may be packaged.

In this way, the connecting strip 50 forms an electrical contact between the contact pads 85 of the dice 72 and 73 and the connection contact regions 83B of the support 70, without any intermediate bonding material being present between the connecting strip 50 and the dice 72, 73.

Because of bonding, and as a result of the elastic pressure exerted by the connecting strip 50, and specifically by the projecting areas 52B (FIGS. 7 and 9), on the contact pads 85, the contact layer 62 undergoes deformation, adapting to the microstructure of the contact pads 85 of the dice 72, 73 (which may also in part deform), thus creating an intimate mechanical contact between them and therefore an optimal electrical contact.

Figure 12:
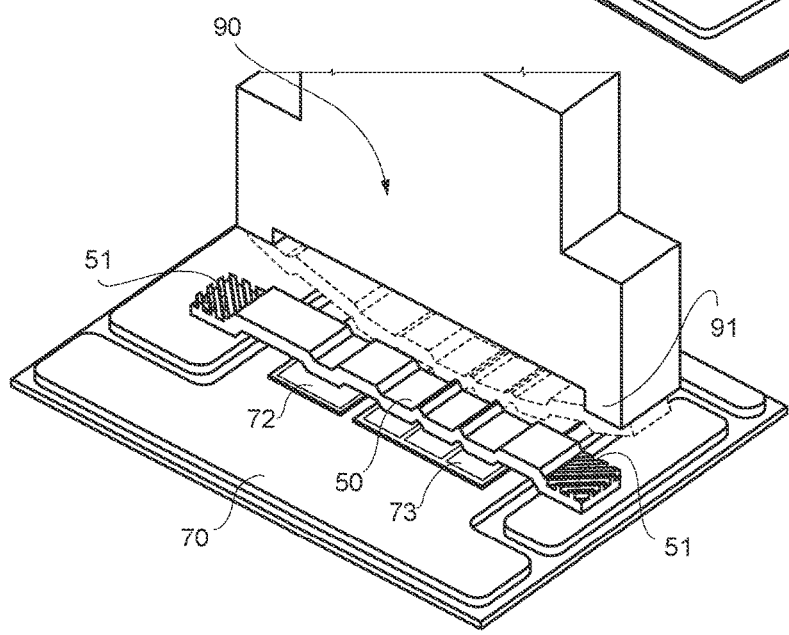
FIG. 12 is a perspective view of the steps of welding the connecting strip of FIG. 7 to the support of FIG. 11.
Figure 13:
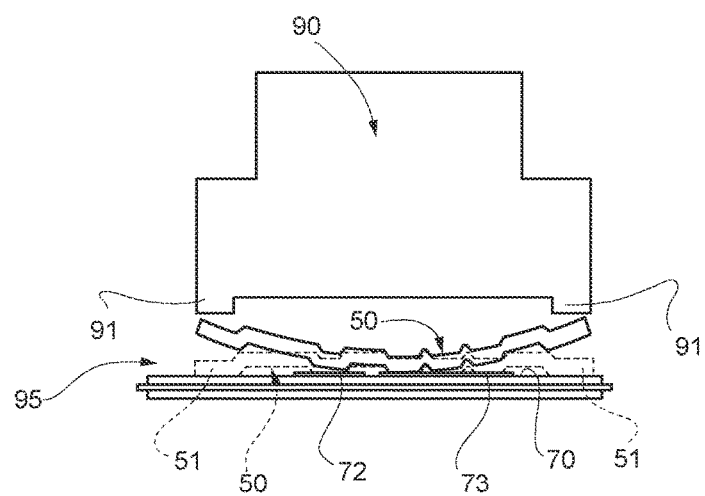
FIG. 13 is a side view of the welding steps of FIG. 12.

Bonding of the connecting strip 50 may be performed by ultrasonic technology, as described below with reference to FIGS. 12-13.

In particular, bonding may be performed using an ultrasonic apparatus such as an ultrasonic welding sonotrode having a welding head 90.

The welding head 90 may have a handling system, for example a suction system, for picking up and holding the connecting strip 50 and has a useful width approximately equal to the connecting strip 50. In particular, the welding head 90 has welding portions 91 arranged at a distance so as to position themselves at the ends 51 of the connecting strip 50 and to exert a pressure on these ends 51 during welding.

For instance, the welding portions 91 of the welding head 90 may be of tungsten carbide and apply a pressure comprised between 3 MPa and 5 MPa at 50 kHz. Welding may be performed at room temperature; in this way, any possible heat that develops (generally lower than 200° C.) does not damage the dice 72, 73, in particular if they are made using silicon-carbide technology. Moreover, since the bonding pressure is applied only on the ends 51 of the connecting strip 50, and the only pressure acting on the dice 72, 73 is the elastic pressure due to the connecting strip 50 after bonding, the dice 72, 73 are not damaged.

The connecting strip 50 and the device 95 described herein have many advantages.

The connecting strip 50 can in fact be manufactured at a reduced cost and has high endurance and reliability. It is able to carry high currents, minimizing parasitic effects, has high temperature resistance, and can be simply bonded, using ultrasonic techniques but also by sintering.

The device 95, including the connecting strip 50, has high reliability and strength of the connections.

In fact, the die or dice are held in an elastic, non-plastic way, therefore blocking is particularly resistant to vibrations and mechanical stresses even over time.

Furthermore, since no bonding material is provided between the connecting strip 50 and the dice 72, 73, which are held in position only by the pressure of the connecting strip 50, there are no regions that can undergo degradation in case of temperature changes, in particular of temperature swings, as for wire bonding or soldering with or without addition of material, but between different material.

Since the contact pads 85, of aluminum, are in contact with portions of the same material as the contact layer 62, there are no differences of thermal coefficient between them, thus eliminating any cause of failure in case of thermal stresses as a result of the different coefficients of thermal expansion (CTE).

The elastic stress generated by deformation keeps the connecting strip 50 in contact with the contact pads 85 of the dice 72, 73 in a reliable way over time.

The bonding process may be carried out at reduced costs, in particular as compared to known wet metal process described above.

Finally, it is clear that modifications and variations may be made to the connecting strip, to the electronic device and to the electrical connection method described and shown herein, without thereby departing from the scope of the present disclosure.

For instance, the connecting strip may be of other conductive elastic materials; bonding the ends may be obtained by sintering, instead of by ultrasonic welding; the die may integrate electronic components and circuits of different types or be formed by packaged devices having external contact regions to be electrically connected in complex systems and/or to supports.

Moreover, the elastic body 61 may be coated by the contact layer only in some portions, for example in the contact area with the die or dice 72, 73 and at the ends 51.

For instance, the die might not be soldered but held in contact with the support only by the elastic force of the connecting strip.

A connecting strip (50) of conductive elastic material, the connecting strip (50) having an arched shape having a concave side (50A) and a convex side (50B) may be summarized as including flat bonding ends (51).

The convex side (50B) may have at least one die connection projecting area (52B), two support connection projecting areas (51) and two recessed areas (53B), the support connection projecting areas forming the connection ends (51) of the connecting strip (50), and each recessed area (53B) may extend between the die connection projecting area (52B) and a respective support connection projecting area (51).

The connecting strip may include an elastic body (61) coated on one side with a contact layer (62).

The elastic body (61) may be of copper or a copper alloy, such as bronze.

The contact layer (62) may be of a softer material than the elastic body (61), in particular aluminum or silver alloy.

The elastic body (61) may have a thickness between 300 µm and 1 mm and the contact layer (62) may have a thickness between 50 and 100 µm in the case of aluminum and 3-5 µm in the case of silver alloy.

An electronic device, may be summarized as including a support (70), at least one die (72, 73) including semiconductor material, and a connecting strip (50), wherein the connecting strip (50) is of conductive elastic material, having a first side and a second side (50B, 50A), the first side (50B) being in contact with the at least one die (72, 73), and wherein the connecting strip (50) may further include flat bonding ends (51) bonded to the support (70) and elastically presses against the at least one die, thus electrically connecting the at least one die (72, 73) to the support (70).

The first side (50B) of the connecting strip (50) may have at least one die connection projecting area (52B), two support connection projecting areas (51), and two recessed areas (53B), the support connection projecting areas forming the connection ends (51) of the connecting strip (50), each recessed area (53B) extending between the die connection projecting area (52B) and a respective support connection projecting area (51), and the die connection projecting area may be in elastic and electrical contact with the at least one die (72, 73).

The connecting strip (50) may include an elastic body (61) coated on one side by a contact layer (62), wherein the contact layer (62) may be in elastic and electrical contact with the at least one die (72, 73) and defines the first side (50B) of the connecting strip.

The elastic body (61) may be of copper or a copper alloy, such as bronze, and the contact layer (62) may be of aluminum or silver alloy.

The contact layer (62) may have a smaller thickness than the elastic body (61).

The elastic body (61) may have a thickness between 300 µm and 1 mm, and the contact layer (62) may have a thickness between 50 and 100 µm in the case of aluminum and 3-5 µm in the case of silver alloy.

A method for bonding at least one die (72, 73) to a support (70) by a connecting strip (50), the at least one die (72, 73) may be summarized as including semiconductor material, and the connecting strip (50) being of conductive elastic material, having an arched shape, with a concave side and a convex side (50A, 50B), and having bonding ends (51), the method including arranging the at least one die (72, 73) on the support (70); arranging the connecting strip (50) on the at least one die (72, 73), with the convex side (50B) facing the at least one die; deforming the connecting strip (50) so as to bring the bonding ends (51) into contact with the support (70), and bonding the bonding ends (51) of the connecting strip (50) to the support (70) so that the connecting strip (50) is in direct electrical contact with the at least one die (72, 73) and elastically presses it against the support (70).

Bonding the bonding ends (51) may include ultrasonic welding.

Bonding the bonding ends (51) may include sintering.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a connecting strip that includes:
an arched shape having a first side opposite a second side, the first side including one or more concave sides, the second side including one or more convex sides opposite of respective concave sides;
a contact layer of a first material covering the second side; and
flat bonding ends on each end of the arched shape; and
a support that includes:
a first die with a first contact pad; and
a second die with at least two second contact pads, the first contact pad and the at least two second contact pads each coupled to one of the one or more convex sides, the first and the at least two second contact pads including the first material.

2. The device according to claim 1, wherein the convex sides have at least one die connection projecting area, two support connection projecting areas and two recessed areas, the support connection projecting areas forming the flat bonding ends of the connecting strip, and wherein each recessed area extends between the die connection projecting area and a respective support connection projecting area.

3. The device according to claim 1, wherein the arched shape includes an elastic body coated on the second side with the contact layer.

4. The device according to claim 3, wherein the elastic body includes copper or a copper alloy.

5. The device according to claim 3, wherein the first material is of a softer material than the elastic body.

6. The device according to claim 5, wherein the first material includes aluminum or silver alloy.

7. The device according to claim 6, wherein the elastic body has a thickness in the range of 300 µm and 1 mm and the contact layer has a thickness in the range of 50 µm and 100 µm in the case of aluminum.

8. The device according to claim 6, wherein the elastic body has a thickness in the range of 300 µm and 1 mm and the contact layer has a thickness in the range of 3 µm and 5 µm in the case of silver alloy.

9. An electronic device, comprising:
a support including:
a first conductive layer;
a first insulating layer on the first conductive layer; and
a second conductive layer on the first insulating layer;
at least one die including semiconductor material on the second conductive layer;
an aluminum contact pad on the at least one die, the aluminum contact pad having a first thickness in the range of 4 µm and 9 µm; and a connecting strip having a first side and a second side opposite the first side, the first side including an aluminum contact layer coupled to the aluminum contact pad, wherein the connecting strip includes flat bonding ends bonded to the support and is elastically against the at least one die, and wherein the first side includes one or more concave sides and the second side includes one or more convex sides opposite of respective concave sides.

10. The electronic device according to claim 9, wherein the first side of the connecting strip has at least one die connection projecting area, two support connection projecting areas, and two recessed areas, the support connection projecting areas forming the flat bonding ends of the connecting strip, each recessed area extending between the die connection projecting area and a respective support connection projecting area, and wherein the die connection projecting area is in elastic and electrical contact with the at least one die.

11. The electronic device according to claim 9, wherein the connecting strip comprises an elastic body coated on one side by the contact layer, wherein the contact layer is in elastic and electrical contact with the at least one die and defines the first side of the connecting strip.

12. The electronic device according to claim 11, wherein the elastic body is of copper or a copper alloy.

13. The electronic device according to claim 12, wherein the contact layer has a smaller thickness than the elastic body.

14. The electronic device according to claim 12, wherein the elastic body has a thickness in the range of 300 µm and 1 mm, and the contact layer has a thickness in the range of 50 µm and 100 µm.

15. The electronic device according to claim 12, wherein the elastic body has a thickness in the range of 300 µm and 1 mm.

16. The electronic device according to claim 9, wherein the connecting strip has an arched shape.

17. An electronic device, comprising:
a support;
a first die on the support;
at least two contact pads coupled to the first die, the at least two contact pads comprising a first material;
a connecting strip having a first side and a second side opposite the first side, the second side coupled to each of the at least two contact pads on the first die,
wherein the connecting strip has an arched shape and includes flat bonding ends on each end of the arched shape, and
wherein the first side includes one or more concave sides and the second side includes one or more convex sides opposite of respective concave sides; and
a contact layer of the first material coupled to the second side of the connecting strip.

18. The device of claim 17, wherein the first side of the connecting strip has at least one first projecting area and at least one first recessed area.

19. The device of claim 18, wherein the second side of the connecting strip has at least one second projecting area corresponding to the at least one first recessed area of the first side and at least one second recessed area corresponding to the at least one first projecting area of the first side.

20. The device of claim 17, wherein the connecting strip includes an elastic body and the contact layer entirely covers the second side.

* * * * *